United States Patent
Wang et al.

(10) Patent No.: US 7,279,756 B2
(45) Date of Patent: Oct. 9, 2007

(54) SEMICONDUCTOR DEVICE WITH HIGH-K GATE DIELECTRIC AND QUASI-METAL GATE, AND METHOD OF FORMING THEREOF

(75) Inventors: Chih-Hao Wang, Hsin-Chu (TW); Ching-Wei Tsai, Taoyuan (TW); Chenming Hu, Alamo, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/185,443

(22) Filed: Jul. 20, 2005

(65) Prior Publication Data

US 2006/0017112 A1    Jan. 26, 2006

Related U.S. Application Data

(60) Provisional application No. 60/590,060, filed on Jul. 21, 2004.

(51) Int. Cl.
*H01L 27/08* (2006.01)

(52) U.S. Cl. ............... 257/369; 257/371; 257/410; 257/E27.046

(58) Field of Classification Search ............ 257/369, 257/371, 410, 411
See application file for complete search history.

(56) References Cited

U.S. PATENT DOCUMENTS

| | | | |
|---|---|---|---|
| 6,063,698 A | 5/2000 | Huang et al. | |
| 6,136,654 A | 10/2000 | Kraft et al. | |
| 6,174,755 B1 | 1/2001 | Liaw | |
| 6,174,775 B1 | 1/2001 | Liaw | |
| 6,232,163 B1 | 5/2001 | Voldman et al. | |
| 6,255,698 B1 * | 7/2001 | Gardner et al. | 257/369 |
| 6,297,103 B1 | 10/2001 | Ahn et al. | |
| 6,352,885 B1 | 3/2002 | Wieczorek et al. | |
| 6,359,311 B1 | 3/2002 | Colinge et al. | |
| 6,479,403 B1 | 11/2002 | Tsei et al. | |
| 6,566,205 B1 | 5/2003 | Yu et al. | |
| 6,596,599 B1 | 7/2003 | Guo | |
| 6,614,067 B2 | 9/2003 | Liaw | |
| 6,632,714 B2 | 10/2003 | Yoshikawa | |
| 6,706,581 B1 | 3/2004 | Hou et al. | |
| 6,716,695 B1 | 4/2004 | Hattangady et al. | |
| 6,720,221 B1 | 4/2004 | Ahn et al. | |

(Continued)

OTHER PUBLICATIONS

Diaz, C. H., "Bulk CMOS Technology for SOC," Extended Abstracts of International Workshop in Junction Technology, Japan Society of Applied Physics, 2002, pp. 91-96.

(Continued)

*Primary Examiner*—Evan Pert
*Assistant Examiner*—Victor A. Mandala, Jr.
(74) *Attorney, Agent, or Firm*—Slater & Matsil, L.L.P.

(57) ABSTRACT

A process and apparatus for a semiconductor device is provided. A device comprises a first transistor having a first charge carrier type. The first transistor comprises a high-k gate dielectric and a first doped electrode. The first charge carrier type comprises one of p-type and n-type and the first doped electrode comprises the other of p-type and n-type. The device further comprises a second transistor having a charge carrier type opposite the first charge carrier type. The second transistor comprises the high-k gate dielectric, and a second doped electrode, wherein the second doped electrode comprises the other of p-type and n-type.

19 Claims, 6 Drawing Sheets

U.S. PATENT DOCUMENTS

| | | | |
|---|---|---|---|
| 6,743,704 B2* | 6/2004 | Takahashi | 438/559 |
| 6,746,900 B1 | 6/2004 | Lin et al. | |
| 2002/0168826 A1 | 11/2002 | Jin et al. | |
| 2003/0042548 A1* | 3/2003 | Maeda et al. | 257/369 |
| 2003/0211880 A1 | 11/2003 | Arghavani et al. | |
| 2004/0026687 A1 | 2/2004 | Grupp et al. | |
| 2004/0033676 A1 | 2/2004 | Arghavani et al. | |
| 2004/0082125 A1 | 4/2004 | Hou et al. | |
| 2004/0087075 A1 | 5/2004 | Wang et al. | |
| 2004/0106287 A1 | 6/2004 | Chau et al. | |
| 2004/0110361 A1 | 6/2004 | Parker et al. | |
| 2004/0121541 A1* | 6/2004 | Doczy et al. | 438/259 |
| 2004/0124476 A1* | 7/2004 | Miyano | 257/371 |
| 2004/0142524 A1 | 7/2004 | Grupp et al. | |
| 2004/0164318 A1 | 8/2004 | Lee et al. | |
| 2005/0136584 A1* | 6/2005 | Boyanov et al. | 438/199 |
| 2005/0269650 A1 | 12/2005 | Pidin | |

OTHER PUBLICATIONS

Fung, S. K. H., et al., "65nm CMOS High Speed, General Purpose and Low Power Transistor Technology for High Volume Foundry Application," Symposium on VLSI Technology Digest of Technical Papers, IEEE, 2004, pp. 92-93.

Hu, C., "Device Challenges and Opportunities," Symposium on VLSI Technology Digest of Technical Papers, IEEE, 2004, pp. 4-5.

Iwamoto, T., et al., "A Highly Manufacturable Low Power and High Speed HfSiO CMOS FET with Dual Poly-Si Gate Electrodes," IEEE, 2003, 4 pages.

Shi, Z., et al., "Mobility Enhancement in Surface Channel SiGe PMOSFETs with $HfO_2$ Gate Dielectrics," Electron Device Letters, IEEE, Jan. 2003, pp. 34-36, vol. 24, No. 1.

Shima, M., "<100> Strained-SiGe-Channel p-MOSFET with Enhanced Hole Mobility and Lower Parasitic Resistance," FUJITSU Sci. Tech. J., Jun. 2003, pp. 78-83, vol. 39, No. 1.

Shiraishi, K., et al., "Physics in Fermi Level Pinning at the PolySi/ Hf-based High-k Oxide Interface," Symposium on VLSI Technology Digest of Technical Papers, IEEE, 2004, pp. 108-109.

Weber, O., et al., "55nm High Mobility SiGe(:C) pMOSFETs with $HfO_2$ Gate Dielectric and TiN Metal Gate for Advanced CMOS," Symposium on VLSI Technology Digest of Technical Papers, 2004, pp. 42-43.

Yang, C. W., et al., "Effect of Polycrystalline-silicon Gate Types on the Opposite Flatband Voltage Shift in $n$-type and $p$-type Metal-oxide-semiconductor Field-effect Transistors for High-$k$-$HfO_2$ Dielectric," Applied Physics Letters, American Institute of Physics, Jul. 14, 2003, pp. 308-310, vol. 83, No. 2.

Sekine, K., et al., "Nitrogen Profile Control by Plasma Nitridation Technique for Poly-Si Gate HfSiON CMOSFET with Excellent Interface Property and Ultra-low Leakage Current," IEEE, 2003, pp. 103-106.

Wang, C.-H., et al., "Low Power Device Technology with SiGe channnel, HfSiON, and poly-Si Gate," pp. 1-3.

Tamura, Y., et al., "SiN-capped HfSiON Gate Stacks with Improved Bias Temperature Instabilities for 65 nm-node Low-Standby-Power Transistors," 2004 Symposium on VLSI Technology Digest of Technical Papers, IEEE, 2004, pp. 210-211.

Ma, T. P., "Making Silicon Nitride Film a Viable Gate Dielectric," IEEE Transactions of Electron Devices, vol. 45, No. 3, Mar. 1998, pp. 680-690.

Cartier, E., et al., "Systematic study of pFET $V_t$ with Hf-based gate stacks with poly-SI and FUSI gates," 2004 Symposium on VLSI Technology, Digest of Technical Papers, pp. 44-45.

Fernandez, F.A., et al., "Properties of $Si_3N_4/Si_xGe_{1-x}$ Metal-Insulator-Semiconductor Capacitors," Electronics Letters, Sep. 26, 1991, vol. 27, No. 20, pp. 1826-1827.

Yeo, Y-C., et al., "Enhanced Performance in Sub-100 nm CMOSFETs using Strained Epitaxial Silicon-Geranium," IEDM 2000, pp. 753-756.

Lu, W., et al., "p-Type SiGe Transistors with Low Gate Leakage Using SiN Gate Dielectric," IEEE Electron Device Letters, vol. 20, No. 10, Oct. 1999, pp. 514-516.

She, M., et al., "JVD Silicon Nitride as Tunnel Dielectric in p-Channel Flash Memory," IEEE Electron Device Letters, vol. 23, No. 2, Feb. 2002, pp. 91-93.

Khare, M., et al., "Highly Robust Ultra-Thin Dielectric for Giga Scale Technology," 1998 Symposium on VLSI Technology Digest of Technical Papers, pp. 218-219.

Wang, D. et al., "High-Quality MNS Capacitors Prepared by Jet Vapor Deposition at Room Temperature," IEEE Electron Device Letters, vol. 13, No. 9, Sep. 1992, pp. 482-484.

Tseng, H.-H., et al., "Ultra-Thin Decoupled Plasma Nitridation (DPN) Oxynitride Gate Dielectric for 80-nm Advanced Technology," IEEE Electron Device Letters, vol. 23, No. 12, Dec. 2002, pp. 704-706.

Tseng, H.-H., et al., "Threshold Voltage Instability and Plasma Induced Damage of PolySi/HfO2 Devices—Positive Impact of Deuterium Incorporation," 2004 IEEE International Conference on Integrated Circuit Design and Technology, pp. 255-259.

* cited by examiner

SEMICONDUCTOR DEVICE WITH HIGH-K GATE DIELECTRIC AND QUASI-METAL GATE, AND METHOD OF FORMING THEREOF

This application claims the benefit of U.S. Provisional Application No. 60/590,060, filed on Jul. 21, 2004, entitled "Semiconductor Device with High-k Gate Dielectric and Quasi Metal Gate," which application is hereby incorporated herein by reference.

TECHNICAL FIELD

This invention and the various embodiments described generally relate to the fabrication of semiconductor devices, and more particularly to transistors having high-k gate dielectrics.

BACKGROUND

In the semiconductor art, it is desirable to improve transistor performance even as devices become smaller due to ongoing scaling. Reduced device scaling with conventional gate dielectrics creates problems in manufacturing reliable MOS transistors, including short channel effects (SCE). It is known in the prior art to use high-k dielectric materials as the gate dielectric material to improve device performance. For purposes of this description, a high-k dielectric is a material having a dielectric constant k greater than that of silicon dioxide, the traditional dielectric material, which has a dielectric constant of approximately 3.9. Materials with a dielectric constant of greater than 3.9 are said to be "high-k" dielectrics. High-k dielectrics provide a similar equivalent oxide thickness (EOT) to larger scaled devices while using a reduced actual dielectric thickness, which meets the reduced scaling requirements of advanced CMOS processes. The use of such materials creates additional problems, however, in the manufacturing and reliability of the transistor devices, including a threshold voltage ($V_t$) variability in the MOS transistors, particularly of p-type MOS transistors, which makes commercial devices using the high-k dielectric materials less desirable. Further, reduction in scale and the use of certain desirable high-k dielectric materials on silicon substrates is believed to contribute to a reported degradation in carrier mobility, which has a negative effect on the performance of transistors manufactured using these materials.

A paper entitled "A Highly Manufacturable Low Power and High Speed HfSiO CMOS FET with Dual Poly-Si Gate Electrodes," by Iwamoto et al., International Electronics Devices Meeting of the IEEE (IEDM), December 2003, describes a MOSFET of the p-type which uses a particular high-k gate dielectric material, HfSiO, over a silicon substrate, and describes the use of certain sidewalls and a channel controlling step to improve the $V_t$ variability effects. This paper describes the threshold voltage shift problem particularly observed in p-type MOS transistors that are fabricated using high-k dielectric materials.

A paper entitled "Fermi Level Pinning at the PolySi/Metal Oxide Interface", by Hobbs et al., 2003 Symposium on VLSI Technology Digest of Technical Papers, describes the role of the poly Si/metal oxide interface on threshold voltage and how it influences poly Si depletion.

A paper entitled "55 nm High Mobility SiGE(:C) pMOS-FETS with HfO$_2$ Gate Dielectric and TiN Metal Gate for Advanced CMOS," by Weber et al., 2004 Symposium on VLSI Technology, Digest of Technical Papers, describes the improved transistor performance obtained for a pMOS transistor fabricated using a SiGe channel material grown by epitaxial deposition of a compressively strained SiGe layer, with a high-k gate dielectric of HfO$_2$, and a metal gate electrode of TiN, having improved carrier mobility and improved $V_t$.

A paper entitled "Mobility Enhancement in Surface Channel SiGe PMOSFETs with HfO$_2$ Gate Dielectrics", by Shi et al., IEEE Electron Device Letters, Vol. 24, No. 1, January 2003, describes PMOS transistors fabricated using strained SiGe as the channel layer and HfO$_2$ as the dielectric, the paper describes enhanced mobility for the devices over conventional silicon devices but also describes a variance in the threshold voltages.

A paper entitled "<100> Strained SiGe Channel p MOS-FET with Enhanced Hole Mobility and Lower Parasitic Resistance", by Shima, Fujitsu Science and Technology Journal 39, Vol. 1, pp. 78-83 (June 2003), describes results obtained in carrier mobility experiments with strained SiGe as a channel material in PMOS devices.

The need for a process and apparatus for a producible, enhanced performance, scalable MOS transistor with a high-k gate dielectric thus exists. These needs are addressed in the present invention.

SUMMARY OF THE INVENTION

Various embodiments of the present invention provide a novel process and structure for a planar MOS transistor using a high-k gate dielectric material and a doped gated electrode material.

A process and apparatus for a semiconductor device is provided. A preferred semiconductor device comprises a first and second transistor. The first transistor has a first conductive channel, wherein the first transistor comprises a high-k gate dielectric and a first doped electrode. Preferably, the first conductive channel comprises one of p-type and n-type and the first doped electrode comprises the other of p-type and n-type. The second transistor has a second conductive channel opposite the first conductive channel. Preferably, the second transistor comprises the high-k gate dielectric, and a second doped electrode, wherein the second doped electrode comprises the other of p-type and n-type.

An alternative semiconductor comprises at least one n-channel device having a high-k gate dielectric and at least one p-channel device having a high-k gate dielectric. Preferably, the n-channel device and the p-channel device have the same doping type of the gate. Preferably, the gate doping concentration is different for the n-channel device and for the p-channel device.

In preferred embodiments of the invention, the dielectric layer comprises an oxide such as SiO$_2$ or a nitrided oxide such as SiON. In another preferred embodiment, the dielectric layer comprises a high-k dielectric, preferably a hafnium or an aluminum-based dielectric. Nitrides and high-k dielectric stacks may be used as the dielectric including Si, O, and N. Tantalum (Ta) or lanthanum (La) oxides, aluminates, aluminum oxide and/or nitrides, combination or stacked dielectrics and other known high-k dielectrics may be used.

A preferred embodiment of the invention comprises an n-channel transistor having a hafnium-based, high-k gate dielectric and a p+ polysilicon gate electrode. Another preferred embodiment comprises a p-channel transistor having an aluminum-based, high-k gate dielectric and an n+ poly gate. In other embodiments, an NMOS and PMOS device may independently include an n+ or p+ doped poly gate. In still other embodiments, an NMOS and PMOS device may independently include a gate dielectric comprising Hf, Al, silicon oxide, nitrided silicon oxide, and combinations thereof.

Embodiments of the invention avoid too large a threshold voltage for PMOS with n+ doped poly gate and for NMOS with p+ doped poly gate. A net concentration of n-type poly dopants in PMOS is preferably at least two times smaller than a net concentration of n-type dopants in NMOS. Such a doping reduces the threshold voltage for PMOS with an n+ doped poly gate. For the same reason, a net concentration of p-type poly dopants in NMOS is preferably at least two times smaller than a net concentration of p-type dopants in PMOS.

Another method for threshold voltage reduction includes forming a counter-doping channel. Embodiments may include a strained channel region beneath the dielectric material. Optionally this channel material may be counter doped to further provide enhanced transistor performance. For example, counter doping by implantation or SiGe may be introduced if the threshold voltage for either NMOS or PMOS devices is too large. In another embodiment, an integrated circuit having both core and peripheral areas may be defined on a substrate, wherein processing steps in the core and peripheral areas may be asymmetric. The substrate may comprise a silicon-on-insulator (SOI), alternatively the substrate may comprise SiGe, Ge, strained Si, strained Ge or a combination or stacked arrangement of Si/SiGe layers. In another embodiment, a metal gate electrode or a combination material including a metal may be used for the gate electrode.

Preferred embodiments of the invention advantageously limit poly gate depletion. Such advantages achieve thinner EOT and higher performance such as are normally achieved with metal gates. In this way, desired metal gate properties are achieved in embodiments of the invention.

Additional features and advantages of embodiments of the invention will be described hereinafter, which form the subject of the claims of the invention. It should be appreciated by those skilled in the art that the specific embodiments disclosed might be readily utilized as a basis for modifying or designing other structures or processes for carrying out the purposes of the present invention. It should also be realized by those skilled in the art that such equivalent constructions and variations on the example embodiments described do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The operation and fabrication of the presently preferred embodiments are discussed in detail below. However, the embodiments and examples described herein are not the only applications or uses contemplated for the invention. The specific embodiments discussed are merely illustrative of specific ways to make and use the invention, and do not limit the scope of the invention or the appended claims.

Figure 1:
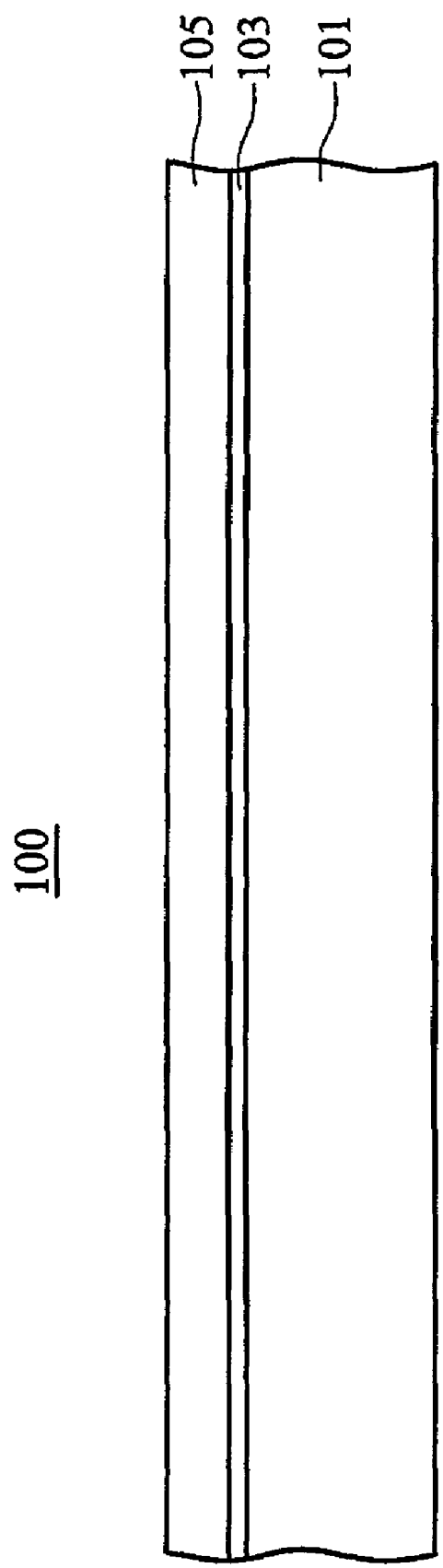
FIG. 1 depicts a cross-sectional view of a substrate prior to isolation trench formation including a deposited oxide and a deposited nitride layer.

FIG. 1 depicts a cross sectional view of a semiconductor device 100 not drawn to scale, but drawn as an illustration only. Semiconductor substrate 101 will provide the basic material for the manufacture of the device. The semiconductor substrate 101 includes silicon, germanium, strained silicon, strained germanium, silicon germanium or SOI substrate, or their combination substrate. Silicon substrate can be epitaxial silicon on silicon and SOI. Germanium substrate includes epitaxial silicon germanium on silicon. The substrate 101 is shown with a pad oxide layer 103 and a nitride layer 105 deposited over it using typical deposition processes, for example the depositions may be a chemical vapor deposition, a plasma enhanced deposition, or any other blanket deposition known in the art, such as reduced pressure CVD or others.

Figure 2:
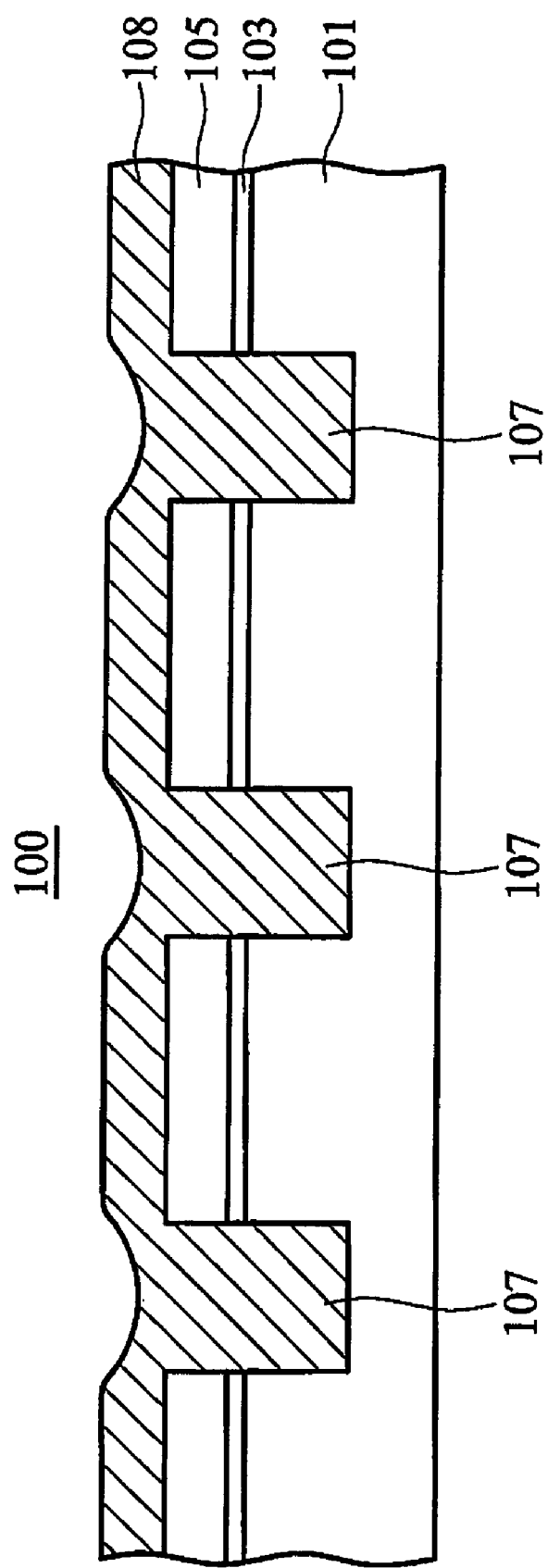
FIG. 2 depicts a cross-sectional view of the substrate following the trench isolation formation and oxide deposition.

FIG. 2 depicts the device 100 after the nitride layer 105 and pad oxide layer 103 are patterned and etched using photolithography techniques to form a hardmask, then an etch is performed and the hardmask is removed, the etch may be for example an HF or piranha etch, an STI oxide 108 is then conformally deposited. The trenches 107 may be about 1000-5000 Angstroms deep or more or less, in an example the completed STI trenches were 2000 Angstroms deep. The STI oxide 108 may be deposited using high density plasma (HDP) or other techniques, for example sub-atmospheric chemical vapor deposition (SACVD) may be used.

Figure 3:
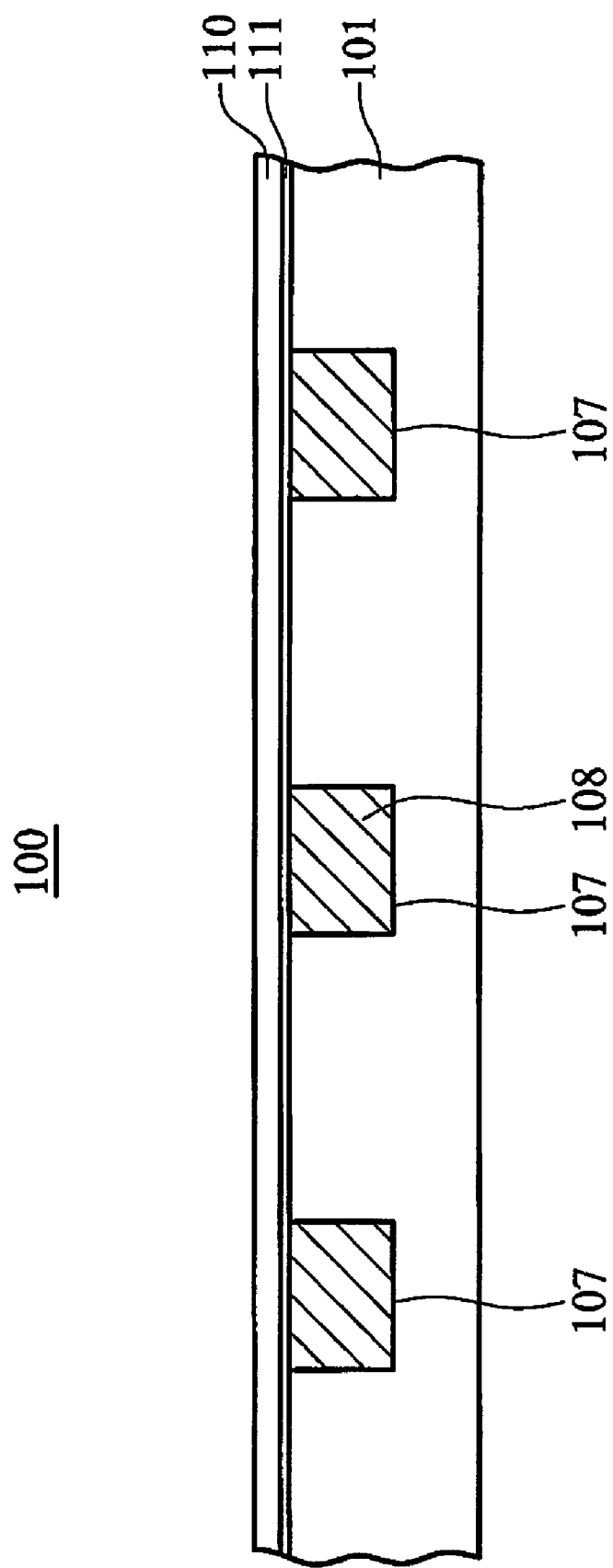
FIG. 3 depicts a cross-sectional view of the substrate following the trench isolation formation and subsequent planarization and following deposition of the high-k gate dielectric.

FIG. 3 depicts the device 100 following the removal of the excess trench oxide, the nitride oxide layer 105 and the pad oxide layer 103, and the deposition of a gate dielectric layer 110. In the removal steps, chemical mechanical polishing (CMP) processes are used to chemically and mechanically remove the trench oxide, nitride, and pad oxide layers to complete the oxide filled shallow trench isolation regions 107 which extend to, or even above, the surface of the substrate. Following the CMP and a clean up step, in a first preferred embodiment of the method of the invention, a high-k gate dielectric 110 is deposited directly onto the substrate 101 and the STI regions 107. In a second preferred embodiment of the method of the invention, an interfacial layer 111 is thermally grown onto the substrate 101 and then the high-k gate dielectric 110 is deposited onto the interfacial layer 111.

Deposition of the dielectric material may be performed by conventional methods including remote plasma CVD (RPCVD), plasma enhanced CVD (PECVD), atomic layer deposition (ALD), MOCVD, PVD, sputtering or other methods known in the art. High-k dielectrics are those dielectrics that have a dielectric constant k of greater than silicon dioxide, about 3.9. Possible high-k dielectrics substantially include silicon nitride, tantalum pentoxide, hafnium oxide, hafnium silicon oxynitride, aluminum oxide, lanthanum oxides, and other high-k dielectric materials known in the art. A range of dielectric constant materials is known, for example for the range of 3.9<k<9, the high-k gate dielectric may include oxy-nitride, oxygen containing dielectrics, nitrogen containing dielectrics, combinations of these and multiple layers of these. For k>9.0, the dielectrics may include any of $HfO_2$, $HfSiO_x$, zirconium oxide such as $ZrO_2$, aluminum oxide such as $Al_2O_3$, titanium oxide such as $TiO_2$, tantalum pentoxide, lanthanum oxide such as $La_2O_3$, barium strontium compounds such as BST, lead based compounds such as $PbTiO_3$, similar compounds such as $BaTiO_3$, $SrTiO_3$, $PbZrO_3$, PST, PZN, PZT, PMN, metal oxides, metal silicates, metal nitrides, combinations and multiple layers of these.

In preferred embodiments, the high-k dielectric includes HfSiON, preferably amorphous HfSiON. The dielectric region may further include Si, Ge, F, C, B, O, Al, Ti, Ta, La, Ce, Bi, and W, for example. The dielectric layer is typically fairly thin, for example 1-100 Angstroms. In one example a high-k dielectric layer of HfSiON was deposited to about 40 Angstroms thickness and having an equivalent oxide thickness (EOT) of less than about 2.0 nanometers.

Figure 4:
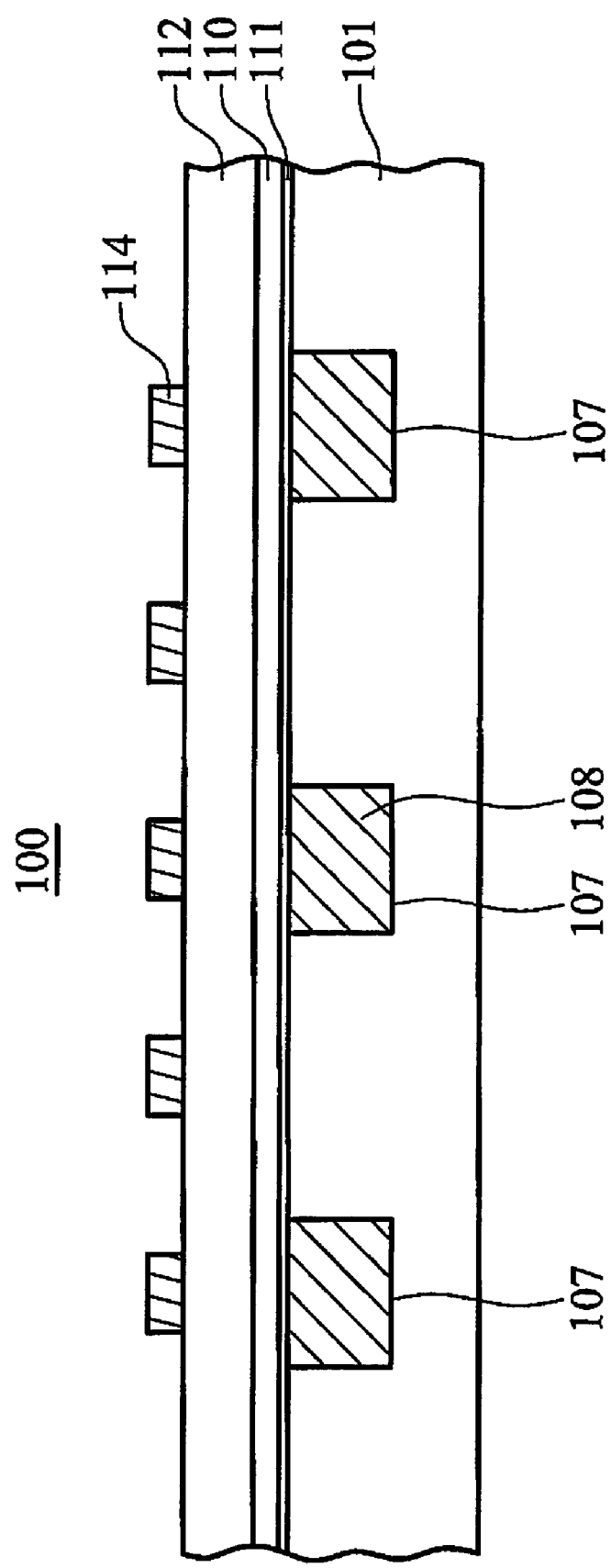
FIG. 4 depicts the substrate following deposition of a gate electrode material over the high-k gate dielectric and following the formation of a pattern mask material.

FIG. 4 depicts the device 100 following the deposition of gate electrode material 112 over the high-k gate dielectric 110 and the formation of a patterned mask 114 for use in etching the gate electrodes. The gate electrode material 112 may be of polysilicon, doped polysilicon, metal compositions such as titanium nitride (TiN), silicides, or other metal gate electrode materials used in the art. A metal gate with a work function of greater than or equal to 1 may be used.

In a preferred embodiment, the gate electrode material 112 is a doped polysilicon gate electrode material. The electrode may be deposited, for example, by a conventional CVD process to a thickness less than about 1000 Angstroms. In preferred embodiments, the gate electrode includes a dopant of a first conductivity type, while the device source and drain regions include a dopant having a second conductivity type. In preferred embodiments, the second conductivity type is opposite to the first conductivity type. For example, for a PMOS or p-channel device, the PMOS gate electrode is preferably n+ doped, while for an NMOS or n-channel device, the NMOS gate electrode is preferably p+ doped. The n+ poly-Si gate or n-type gate is preferably doped with a 25 keV, $1 \times 10^{15}$ $cm^{-2}$ implant dose of phosphorus. The p+ poly-Si gate or p-type gate is preferably doped with a 10 keV $3.5 \times 10^{15}$ $cm^{-2}$ implant dose of boron. A spike activation anneal is done at approximately at 1050° C. In this situation, conductive channels of NMOS and PMOS transistors in the substrate are counter doped using conventional methods, such as ion implantation. Typically a boron dopant is used to counter dope the channel for a PMOS transistor. Other dopants that can be used are Al, Ga, and In for p-channels. On the other hand, typically a phosphorus dopant is used to counter dope the channel for an NMOS transistor. Other dopants that can be used are N, As, and Sb for n-channels.

In alternative preferred embodiments, the n-channel device and the p-channel device have the same doping type of the gate, and the gate doping concentrations of the n-channel and the p-channel devices are different respectively. For example, the gate doping concentration of an n-type gate in an n-channel device is higher than that of a p-channel device. Alternatively, the gate doping concentration of a p-type gate in a p-channel device is higher than that of an n-channel device.

Electrodes may be conventionally doped in situ with conventional dopants. Preferred n-type dopants, include antimony, phosphorous, or arsenic, for example. Examples of preferred p-type dopants include boron, aluminum, gallium, or indium.

The hard mask 114 defines areas for forming transistor gate electrodes over the substrate, and areas for making connectivity at the polysilicon level over the STI regions 107. The formation of the gate electrode material 112 will not create an active device over the STI regions 107 (as there is no active silicon area for receiving subsequent source and drain diffusions) but instead provides additional connectivity areas to those portions of the gate electrodes, which may in fact overly other active areas in the substrate in regions that are not visible in the cross section of the figure.

Figure 5:
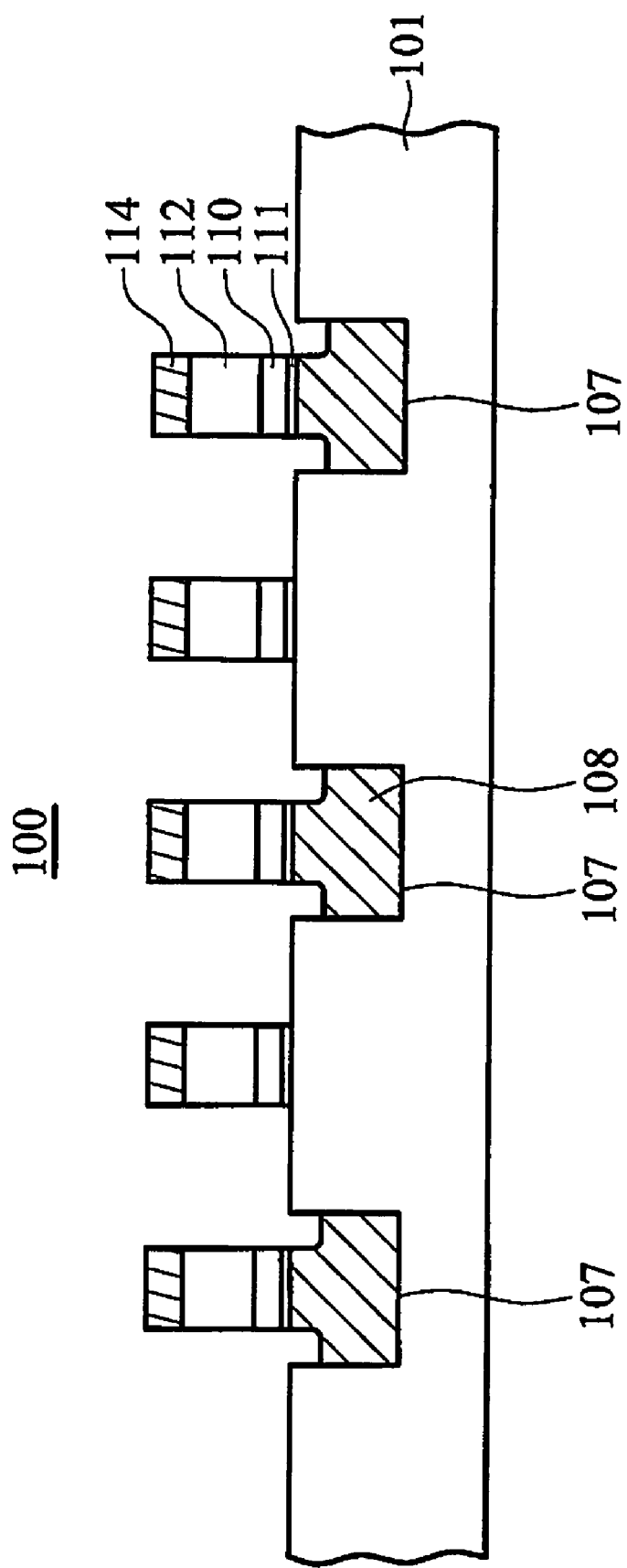
FIG. 5 depicts the substrate following the patterning of the gate electrode material by etching the gate electrode material and the high-k gate dielectric using the mask material.

FIG. 5 depicts the device 100 in the same cross sectional view as in the prior figures following an etch step which patterns the gate electrode material 112, the high-k gate dielectric 110 and the interfacial layer 111. The etch is then allowed to continue into the substrate 101 and into the STI regions 107, to extend the etched region to a depth which lies below the bottom of the high-k gate dielectric 110. In FIG. 5 the substrate 101 is shown removed to a depth below the bottom of the high-k gate dielectric 110 by some amount, the etch used is also highly selective for the STI oxide and removes significantly more of the STI oxide 108 than it does of the silicon substrate 101.

Figure 6:
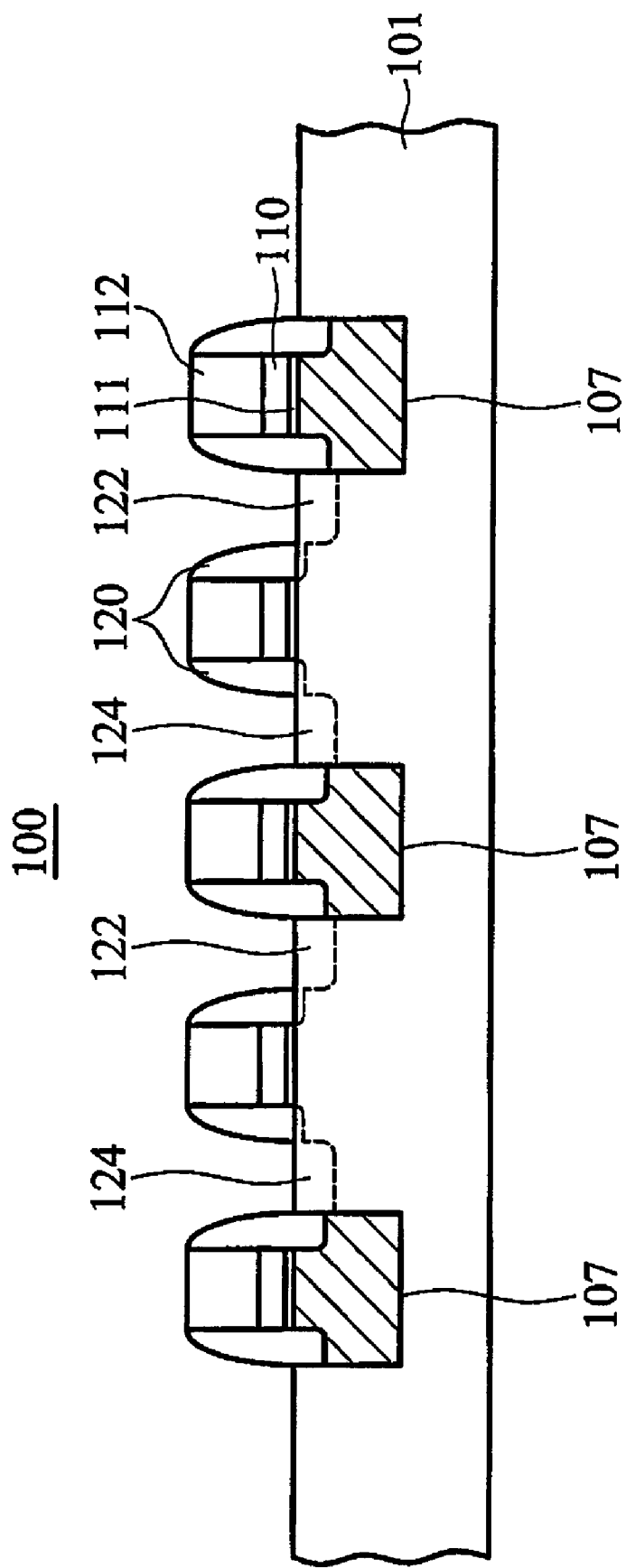
FIG. 6 depicts the substrate following the completion of transistors having source and drain regions aligned to the gate electrodes of FIG. 5.

FIG. 6 depicts the substrate 101 of the device 100 in accordance with a preferred embodiment of the present invention after sidewalls 120 are deposited and patterned on either side of the gate electrodes 112 and gate dielectric 110.

Sidewall spacer 120 is deposited using a dielectric to provide a protective spacer over the sidewalls of the electrode and extending beneath the bottom of the high-k dielectric 110. The sidewall is preferably nitrogen containing oxide or silicon nitride material, and may be deposited by low temperature deposition techniques including PECVD and remote plasma CVD (RPCVD). The sidewall spacers 120 may comprise silicon nitride or silicon oxynitrides. In a preferred embodiment the oxide or nitride sidewall spacer may be some 40 Angstroms wide. In an example the sidewall spacer is $SiO_xN_y$. A lightly doped drain (LDD) may be formed in the substrate areas using ion implantation as is known in the conventional art prior to the sidewall spacer region formation described here.

FIG. 6 further depicts the formation of source and drain diffusions 122 and 124 which are formed in the substrate areas using ion implantation and thermal anneal procedures as are known in the conventional art. In this figure source and drain diffusions 122 and 124 with a lightly doped drain structure are shown. The gate electrode 112, gate dielectric 110, and the source and drain diffusions 122, 124 together form a planar MOS transistor. Depending on the type of dopants used in the source and drain and the substrate, the transistors may be of a p-type MOS transistor or an n-type MOS transistor. In CMOS device 100, the transistors may be formed in well diffusions (not shown) that were performed prior to the STI region formation described here, as is known in the art, the wells being isolated by the STI regions.

Therefore, the semiconductor device 100 comprises a first transistor having a first conductive channel, the first transistor comprises a high-k gate dielectric and a first doped electrode, the first conductive channel comprises one conductive type of p-type and n-type and the first doped electrode comprises the other conductive type of p-type and n-type, that is, the first conductive channel and the first doped electrode have different conductive types. The semiconductor device 100 also comprises a second transistor having a second conductive channel opposite the first conductive channel, the second transistor comprises the high-k gate dielectric, and a second doped electrode, the second doped electrode and the first doped electrode have the same conductive type. At least one of the first and second transistor comprises a counter doping conductive channel. In this situation, the conductive channels of NMOS and PMOS transistors in the substrate are counter doped using conventional methods, such as ion implantation. The counter doping conductive channel for a PMOS transistor is p-type. Typically a boron dopant is used to counter dope the channel for a PMOS transistor. Other dopants that can be used are Al, Ga, and In for p-channels. On the other hand, the counter doping conductive channel for an NMOS transistor is n-type. Typically a phosphorus dopant is used to counter dope the channel for a NMOS transistor. Other dopants that can be used are N, As, and Sb for n-channels.

Following the steps described so far to form the cross section shown in FIG. 6, the integrated circuit is completed using conventional semiconductor processing steps as are known in the art; for example silicide may be formed by depositing a metal such as titanium or cobalt and then treated to form self-aligned silicide, or salicide, on top of the gate electrode 112, the source and drain regions 122, 124, and other areas to provide a lower resistance and improve device performance, however this step is optional. Following the salicide step, if used, interlevel insulation layers are formed above the substrate using deposition steps to deposit oxide, nitride or other conventional insulation layers, typically silicon dioxide is formed. Contact areas are patterned and etched into the insulators to expose the source, drain, and gate electrodes, the resulting vias are filled with conductive material to provide electrical connectivity from metallization layers above the interlevel insulating layers down to the gate electrodes, the source and the drain regions. Metallization layers of aluminum or copper, may be formed over the interlevel insulation layers using known techniques such as an aluminum metallization process or a dual damascene copper metallization process to provide one, or several, wiring layers that may contact the vias and make electrical connections to the gate electrodes 112 and the source and drain regions 122, 124. Conventional clean up, passivation, die saw, singulation, packaging, assembly and test steps are used to complete the integrated circuit devices formed on the substrate 101.

The embodiments of the invention described above are exemplary and not limiting, and variations that are apparent to those skilled in the art that include the features of the invention are within the scope of the invention and the appended claims.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
   a first transistor comprising
      a first-transistor n-type channel,
      a first-transistor high-k gate dielectric formed over the first-transistor n-type channel, and
      a first-transistor n-type doped gate electrode formed over the first-transistor high-k gate dielectric; and
   a second transistor comprising
      a second-transistor p-type channel,
      a second-transistor high-k gate dielectric formed over the second-transistor p-type channel, and
      a second-transistor n-type doped gate electrode formed over the second-transistor high-k gate dielectric.

2. The semiconductor device according to claim 1, wherein the first-transistor high-k gate dielectric comprises a high-k gate dielectric material having a dielectric constant greater than 3.9, and wherein the second-transistor high-k gate dielectric comprises the high-k gate dielectric material.

3. The semiconductor device of claim 2, wherein the high-k gate dielectric material comprises aluminum oxide, hafnium oxide, or combinations thereof.

4. The semiconductor device of claim 2, wherein an effective oxide thickness for the high-k gate dielectric material is less than about 2 nm.

5. The semiconductor device of claim 2, wherein the high-k gate dielectric material comprises a material selected from the group consisting of silicon, silicon nitride, tantalum, lanthanum, hafnium, aluminum, oxides, and combinations thereof.

6. The semiconductor device of claim 1, wherein the first and second transistor doped gate electrodes comprise a material selected from the group consisting of silicon, germanium, polysilicon, amorphous silicon, and combinations thereof.

7. The semiconductor device according to claim 1, wherein the first-transistor n-type channel comprises a material selected from the group consisting of silicon, germanium, carbon, strained silicon, strained carbon, strained germanium, strained silicon germanium, and combinations thereof.

8. The semiconductor device of claim 1, wherein an n-type gate doping concentration of the first-transistor n-type doped gate electrode is greater than that of the second-transistor n-type doped gate electrode.

9. The semiconductor device of claim 8, wherein a net of the n-type gate doping concentration for the second-transistor n-type doped gate electrode is at least two times smaller than that of the first-transistor n-type doped gate electrode.

10. The semiconductor device of claim 1, wherein the first-transistor gate electrode and/or the second-transistor gate electrode comprise metal.

11. A semiconductor device comprising:
    a first transistor comprising
       a first-transistor p-type channel, a first-transistor high-k gate dielectric formed over the first-transistor p-type channel, and a first-transistor p-type doped gate electrode formed over the first-transistor high-k gate dielectric; and a second transistor comprising a second-transistor n-type channel, a second-transistor high-k gate dielectric formed over the second-transistor n-type channel, and a second-transistor p-type doped gate electrode formed over the second-transistor high-k gate dielectric;

and wherein a gate doping concentration is different for the n-channel device and for the p-channel device.

12. The semiconductor device according to claim 11, wherein the high-k gate dielectric comprises a material having a gate dielectric constant greater than 3.9, wherein the first-transistor high-k gate dielectric comprises a high-k gate dielectric material having a dielectric constant greater than 3.9, and wherein the second-transistor high-k gate dielectric comprises the high-k gate dielectric material.

13. The semiconductor device of claim 12, wherein the high-k gate dielectric material comprises aluminum oxide, hafnium oxide, or combinations thereof.

14. The semiconductor device of claim 12, wherein an effective oxide thickness for the high-k gate dielectric material is less than about 2 nm.

15. The semiconductor device of claim 11, wherein an p-type gate doping concentration of the first-transistor p-type doped gate electrode is greater than that of the second-transistor p-type doped gate electrode.

16. The semiconductor device of claim 15, wherein a net of the p-type gate doping concentration for the second-transistor p-type doped gate electrode is at least two times smaller than that of the first-transistor p-type doped gate electrode.

17. The semiconductor device of claim 11, wherein the first-transistor gate electrode and/or the second-transistor gate electrode comprise metal.

18. A semiconductor device comprising:

a first transistor comprising a first-transistor channel having a first-type of doping, a first-transistor high-k gate dielectric formed over the first-transistor channel, and a first-transistor gate electrode formed over the first-transistor high-k gate dielectric, the first-transistor gate electrode having the first-type of doping; and a second transistor comprising a second-transistor channel having a second-type of doping, the second-type of doping being different from the first-type of doping, a second-transistor high-k gate dielectric formed over the second-transistor channel, and a second-transistor gate electrode formed over the second-transistor high-k gate dielectric, the second-transistor gate electrode having the first-type of doping, wherein the first-type of doping is p-type or n-type, wherein the second-type of doping is p-type or n-type, but if the first-type of doping is p-type, then the second-type of doping is n-type, and if the first-type of doping is n-type, then the second-type is p-type, and wherein the first-type gate doping concentration of the first-transistor gate electrode is greater than that of the second-transistor gate electrode.

19. The semiconductor device of claim 18, wherein a net of the first-type gate doping concentration for the second-transistor gate electrode is at least two times smaller than that of the first-transistor gate electrode.

* * * * *